United States Patent
Chen et al.

(10) Patent No.: US 6,815,302 B2
(45) Date of Patent: Nov. 9, 2004

(54) METHOD OF MAKING A BIPOLAR TRANSISTOR WITH AN OXYGEN IMPLANTED EMITTER WINDOW

(75) Inventors: Alan Sangone Chen, Windermere, FL (US); Yih-Feng Chyan, New Providence, NJ (US); Chung Wai Leung, Milpitas, CA (US); Yi Ma, Orlando, FL (US); William John Nagy, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 254 days.

(21) Appl. No.: 10/028,614
(22) Filed: Dec. 21, 2001
(65) Prior Publication Data US 2003/0119270 A1 Jun. 26, 2003

(51) Int. Cl.⁷ .......................................... H01L 21/8228
(52) U.S. Cl. ........................ 438/323; 438/324; 438/343; 438/365
(58) Field of Search ................................. 438/202, 234, 438/369, 528, 343, 324, 323, 365; 257/197, 198

(56) References Cited

U.S. PATENT DOCUMENTS

| 5,960,268 | A | * | 9/1999 | Aihara | ...................... 438/166 |
| 6,271,577 | B1 | * | 8/2001 | Havemann | .................. 257/592 |
| 6,399,993 | B1 | * | 6/2002 | Ohnishi et al. | ............. 257/370 |

* cited by examiner

*Primary Examiner*—Hsien-Ming Lee

(57) ABSTRACT

The present invention provides a method of manufacturing a bipolar transistor. The method may comprise forming a collector in a semiconductor wafer substrate, forming a base in the collector, implanting an oxide region within said collector and over the base, and forming an emitter over the substrate such that the oxide region is located between the emitter and the base.

20 Claims, 5 Drawing Sheets

METHOD OF MAKING A BIPOLAR TRANSISTOR WITH AN OXYGEN IMPLANTED EMITTER WINDOW

TECHNICAL FIELD OF THE INVENTION

The present invention is directed, in general, to methods of manufacturing semiconductor devices and, more specifically, to a method of manufacturing a bipolar transistor having an oxygen implanted emitter window.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit. One way in which the semiconductor industry has increased the speed of the integrated circuit is to continue to shrink the size of the transistor. Over the last few years, the device size of the transistor has gone from 0.5 µm to 0.32 µm to 0.25 µm and now transistor device sizes are heading to the 0.12 µm range and below. With each decrease in size, the semiconductor industry has faced new challenges.

One such challenge is controlling the thickness of the interfacial oxide region between the emitter and the base or collector. Variations in the thickness of the oxide region between the emitter and the base may result in wafer to wafer or lot to lot variations in device current gain and breakdown voltage. Additionally, in load-lock furnaces, especially those employed in exceptionally clean fabrication environments, the difficulty in controlling the thickness of the oxide region may result in entirely eliminating current gain. For example, the interfacial oxide region developed in load-lock furnaces utilized in exceptionally clean fabrication environments may grow to thicknesses varying from wafer to wafer and from lot to lot anywhere between 0–1 nm, resulting in undesirable gain and breakdown voltage variation from wafer lot to wafer lot.

Previous attempts to resolve the lack of uniformity of the oxide region thickness have included employing ozonated, deionized water proximate the emitter area to form an interfacial oxide region prior to depositing the poly silicon. While this provides slight improvement in current gain as well as moderate uniformity from wafer to wafer and lot to lot, it does not completely resolve the current gain and uniformity issues as desired. Additionally, such an approach does not provide precise control over the thickness of the resulting oxide region.

Accordingly, what is needed in the art is a method of manufacturing a bipolar transistor that avoids the disadvantages associated with the prior art bipolar transistor manufacturing methods.

SUMMARY OF THE INVENTION

To address the above-discussed deficiencies of the prior art, the present invention provides a method of manufacturing a bipolar transistor. In one embodiment, the method comprises forming a collector in a semiconductor wafer substrate, forming a base in the collector, and implanting an oxide region within the collector and over the base. The method further comprises forming an emitter over the substrate such that the oxide region is located between the emitter and the base.

The foregoing has outlined preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the present invention. Those skilled in the pertinent art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that, in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
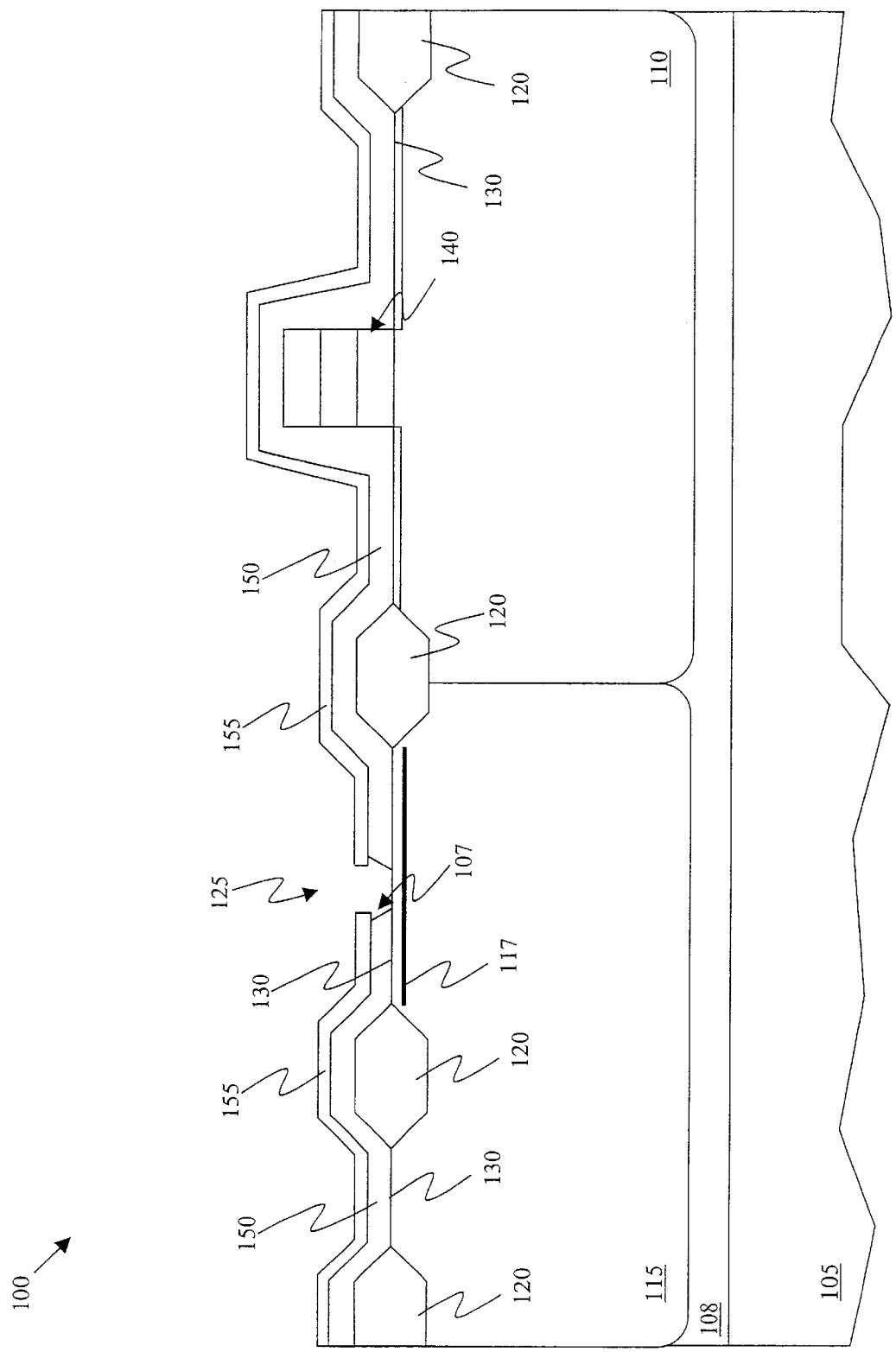
FIG. 1 illustrates the formation of an opening within a partially completed semiconductor device.

Turning initially to FIG. 1, there is illustrated the formation of a semiconductor device 100 constructed according to the principles of the present invention. In the illustrated embodiment, a CMOS transistor tub 110 and a collector tub 115 are conventionally located over a semiconductor wafer substrate 105. The illustrated CMOS transistor tub 110 may be doped to provide either a p-type metal oxide semiconductor (PMOS) transistor or an n-type metal oxide semiconductor (NMOS) transistor, depending on the device design. Commonly, the illustrated CMOS transistor tub 110, whether it is for a PMOS or an NMOS device, will have opposing device tubs formed adjacent it, on opposing sides, e.g., a collector tub 115 to one side of the CMOS transistor tub 110 and an opposing CMOS transistor tub to the other side (not shown). The transistor tub 110 and the collector tub 115 are preferably formed in a conventional epitaxially-grown layer 108 of the semiconductor device 100. The collector tub 115 may be conventionally doped with an n-type dopant.

Also illustrated in FIG. 1 are field oxides 120, oxide regions 130, a CMOS gate structure 140 and a base 117, all of which may be conventionally formed. The CMOS gate structure 140 is located over the CMOS transistor tub 110.

In one embodiment, the collector tub 115 may be exposed to an implanting step, which forms the base 117 that is located in the collector tub 115.

A dielectric layer 150 may be conformally formed over the field oxides 120, oxide region 130 and CMOS gate structure 140. In one embodiment, the dielectric layer 150 may be a silicon dioxide ($SiO_2$) layer formed from the deposition of silane. In another embodiment the silicon dioxide can be formed from tetraethylorthosilicate (TEOS). In yet another embodiment, the dielectric layer 150 may comprise both the $SiO_2$ and the TEOS. Of course, the dielectric layer 150 may comprise additional layers. In a preferred embodiment the dielectric layer 150 is formed to a thickness of about 140 nm. However, one skilled in the art understands that the present invention may use varying thicknesses and materials depending on the design of the device.

A dielectric layer 155, such as an amorphous silicon or poly-silicon layer, may be conformally formed over the dielectric layer 150. In a preferred embodiment the dielectric layer 155 is formed to a thickness of about 60 nm. However, one skilled in the art understands that the present invention may use varying thicknesses depending on the design of the device.

FIG. 1 also illustrates an opening 125 that has been formed by conventional processes. The partially completed semiconductor device 100 is conventionally patterned with photoresist (details not shown) to expose a portion where the opening 125 is desired. The exposed portion of the semiconductor device 100 is then subjected to an etch process which forms the illustrated opening 105. The opening 105 is formed down to the collector tub 115 or base 117. It should be noted that, in the illustrated embodiment, the opening 125 has a dished out portion 107. The dished out portion 107 results from the etchant etching the layer 150 faster than the layer 155. In a preferred embodiment of the invention, the etchant is a conventional wet oxide etch. However, one having skill in the art understands that the materials being etched and the etching chemistry being used could vary, in essence altering the above-described etching process.

Figure 2:
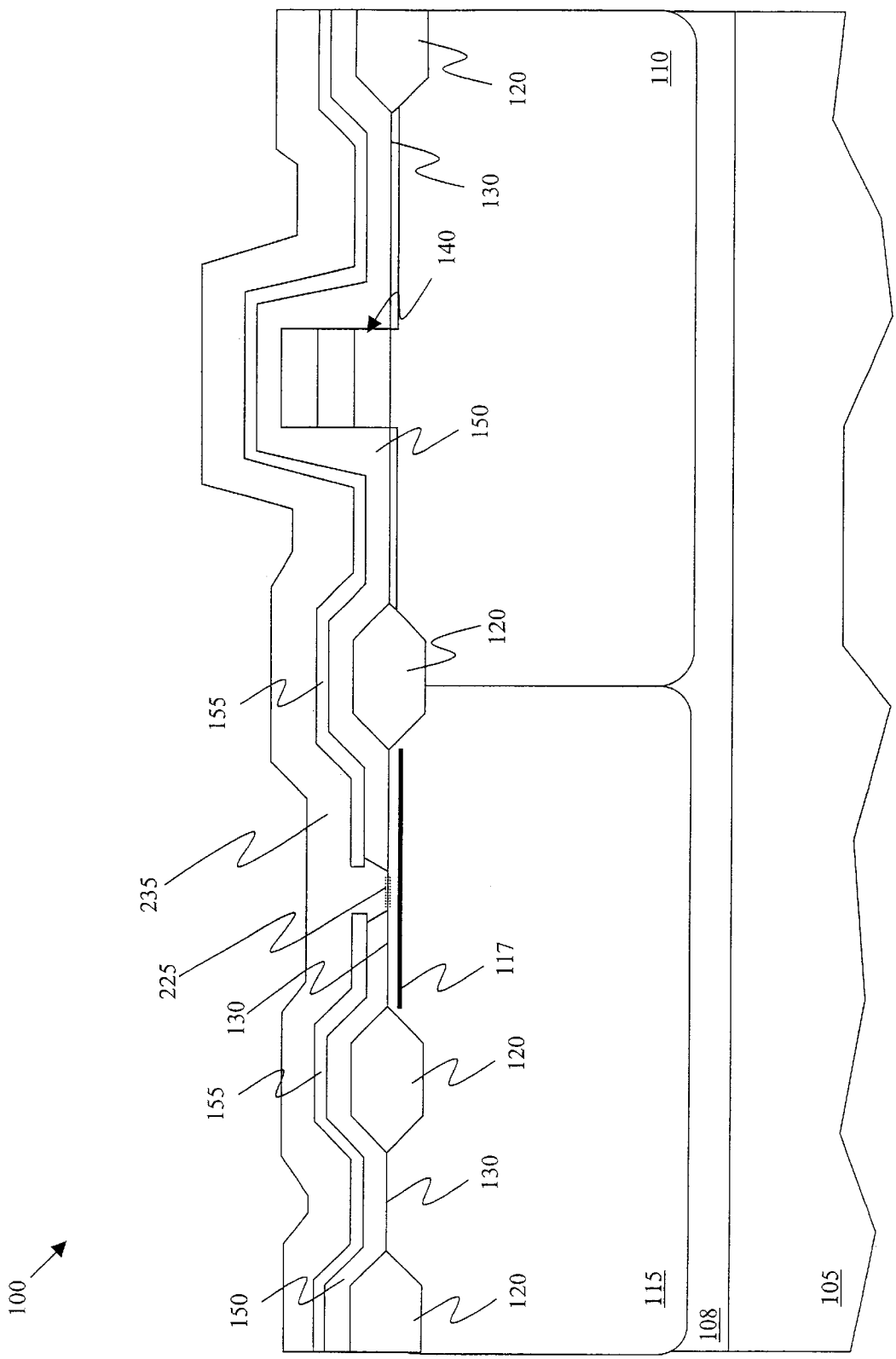
FIG. 2 illustrates the formation of an emitter poly over an oxide region of the partially completed semiconductor device illustrated in FIG. 1.

Referring now to FIG. 2, an oxide region 225 is shown implanted within the collector 115 and over the base 117. In an advantageous embodiment, the oxide region 225 may be formed in the base 117. The oxide region 225 may be implanted using a dopant concentration ranging from about 1E12 atoms/$cm^3$ to about 1E16 atoms/$cm^3$, and may be formed as wide as the emitter opening 125. In one embodiment, the oxide region 225 may be implanted using a power ranging from about 0.5 KeV to about 100 KeV, a temperature ranging from about 0° C. to about 400° C. In one embodiment, the surface of the collector tub 115 or the base 117 exposed by the opening 225 may be conventionally cleaned prior to its formation.

In one embodiment, the resulting oxide region 225 may be 200–1000 nm wide and 0.5–0.7 nm thick. However, one skilled in the art understands that the present invention may use varying widths and thicknesses depending on the design of the device. Semiconductor devices having oxide regions 0.2–1.0 nm thick have been found to provide adequate current gain and breakdown voltage and are well within the scope of the present invention.

The formation of the oxide region 225 by implantation provides uniformity between the thickness of the oxide region 225 and the thicknesses of the oxide regions of bipolar transistors and other semiconductor devices manufactured concurrently, between devices manufactured in the same lot (e.g., a wafer to wafer comparison), and between devices manufactured in different lots. In turn, the oxide region uniformity provides uniformity of performance characteristics between devices, including current gain and breakdown voltage. Such uniformity is especially advantageous in exceptionally clean environments, such as those encountered with the use of load-lock furnaces, where the lack of oxygen impedes uniform growth or deposition of an oxide region, as seen in wafer to wafer and lot to lot comparisons. In one embodiment, the above described method of manufacturing may reduce the variation in the thicknesses of the oxide regions to about 5%, and may reduce the variation in the current gain and breakdown voltage of the devices to about 10%.

After the oxide region 225 is formed, a conformal emitter poly layer 235 is conventionally and conformally deposited over the dielectric layer 155, including the dished out portion 105, and the oxide region 225. In a preferred embodiment, the emitter poly layer 155 is formed to a thickness of about 240 nm. However, one skilled in the art understands that the present invention may use varying thicknesses depending on the design of the device. The structure 100 may then be annealed at, for example, about 1000° C. for about 10 seconds.

Figure 3:
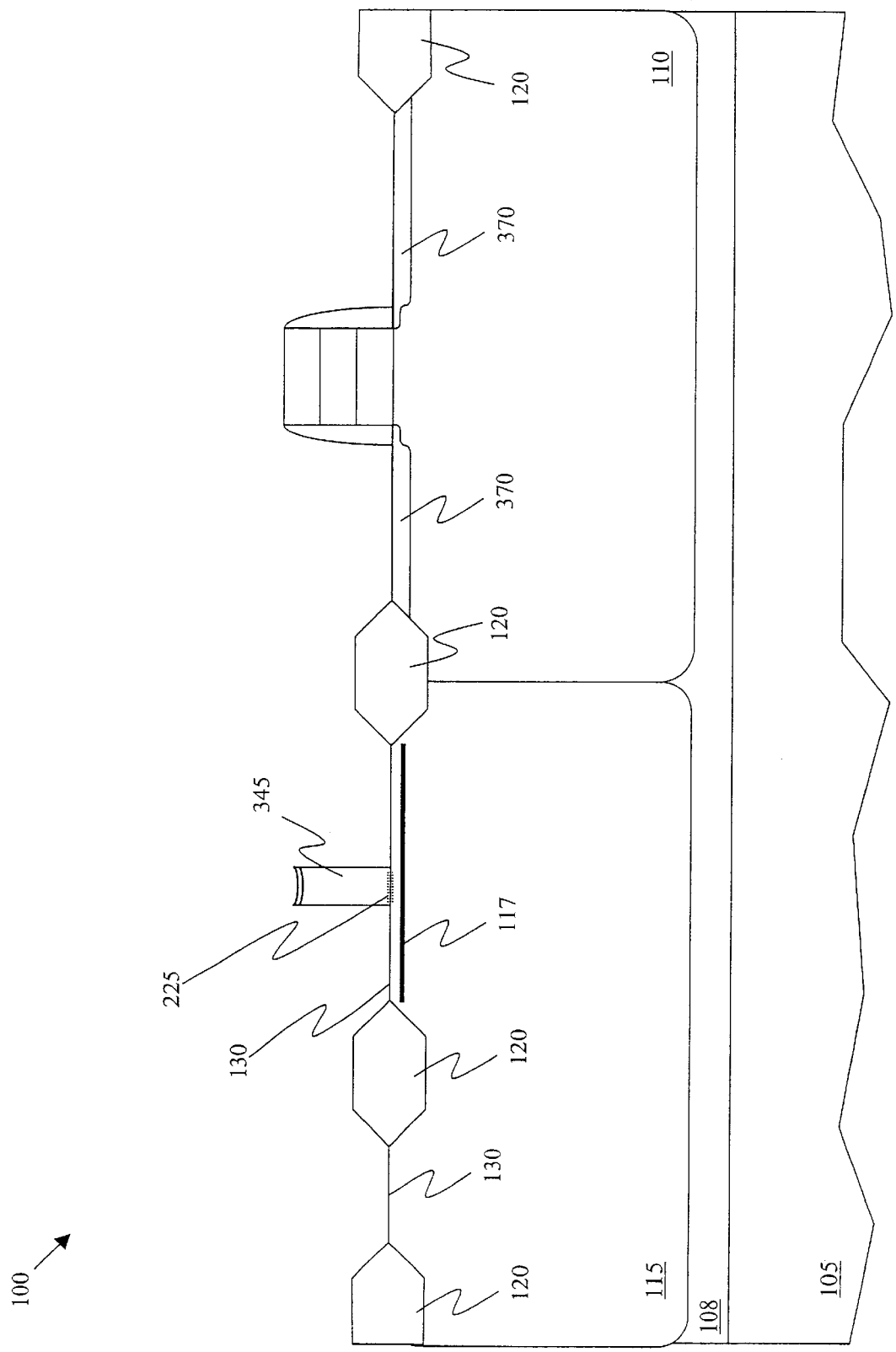
FIG. 3 illustrates the semiconductor device constructed according to the principles of the present invention.

Turning to FIG. 3, the remainder of the semiconductor device 100 may be conventionally completed. In one embodiment, this may include patterning the emitter 345, implanting source/drain regions 370, and performing a second anneal process. The emitter 345 is located on and is in contact with at least a portion of the implanted oxide region 225.

One skilled in the art understands that the above described method for manufacturing a bipolar transistor including implanting an oxide region may be employed in the manufacture of a single bipolar transistor or, in the alternative, in the manufacture of an integrated circuit (IC) comprising a bipolar transistor and one or more CMOS transistors. In that regard, a CMOS transistor could be formed in a complementary fashion with respect to an adjacent CMOS transistor, wherein the bipolar transistor is formed thereafter. In an alternative embodiment, the CMOS transistor may be formed in a complementary fashion with respect to both the bipolar transistor and an adjacent CMOS transistor, since the bipolar transistor and the adjacent CMOS transistor may typically use similar dopants.

Figure 4:
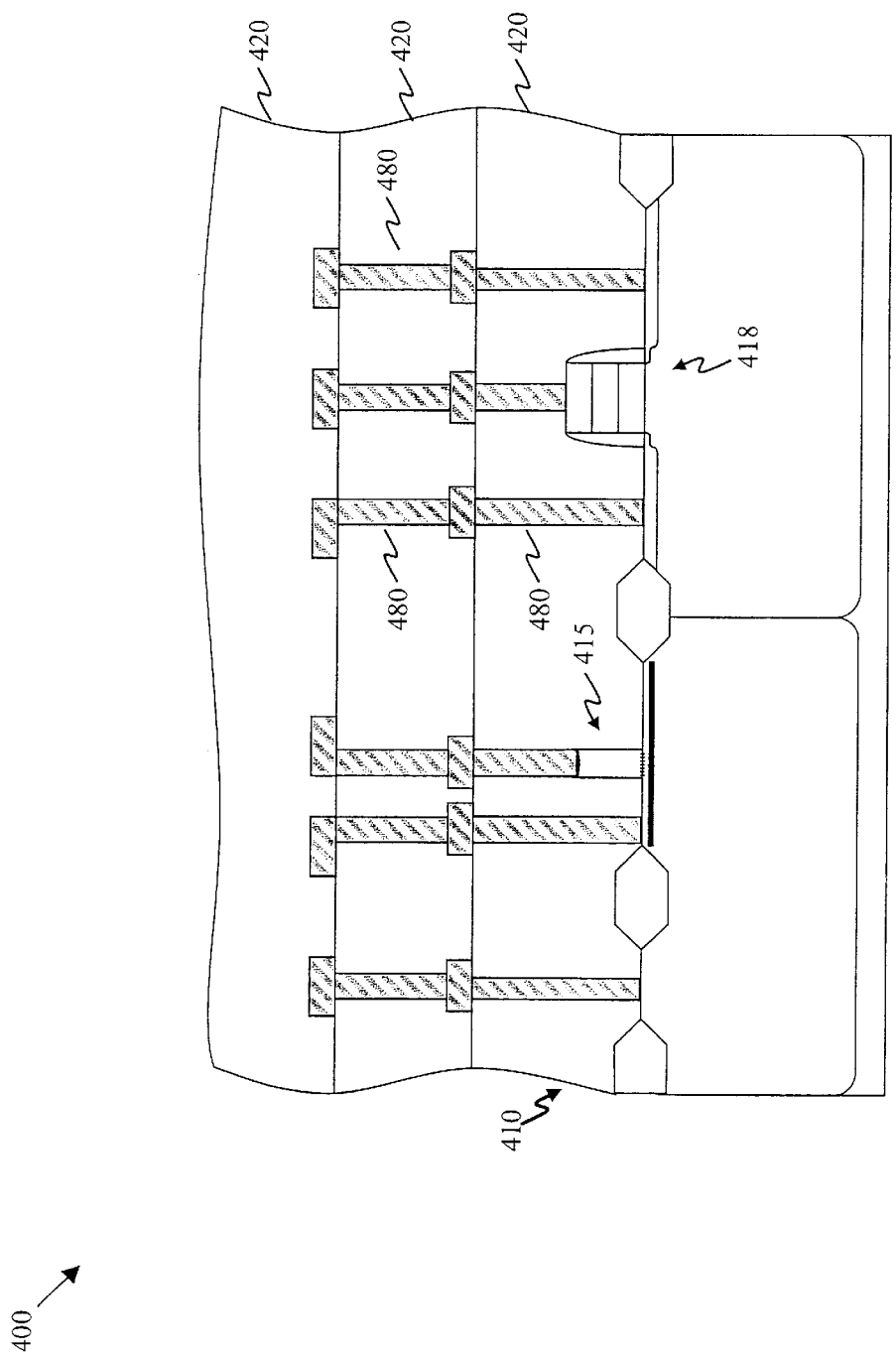
FIG. 4 illustrates an integrated circuit (IC) constructed according to the principles of the present invention.

Turning to FIG. 4, illustrated is a sectional view of a conventional integrated circuit (IC) 400, incorporating a semiconductor device 410 similar to the completed semiconductor device 100 illustrated in FIG. 3. The IC 400 may also include active devices, such as other transistors, memory devices, or other types of active devices. The IC 400 may further include passive devices, such as inductors or resistors, or it may also include optical devices or optoelectronic devices. Those skilled in the art are familiar with these various types of devices and their manufacture.

In the particular embodiment illustrated in FIG. 4, the IC 400 includes the semiconductor device 410 having one or more Bipolar transistors 415 and one or more CMOS transistors 418. As illustrated, the IC 400 further includes dielectric layers 420 located over the transistors 415, 418. Additionally, a plurality of interconnect structures 480 are located within the dielectric layers 420, contacting the transistors 415, 418 to form the operational integrated circuit 400.

Figure 5:
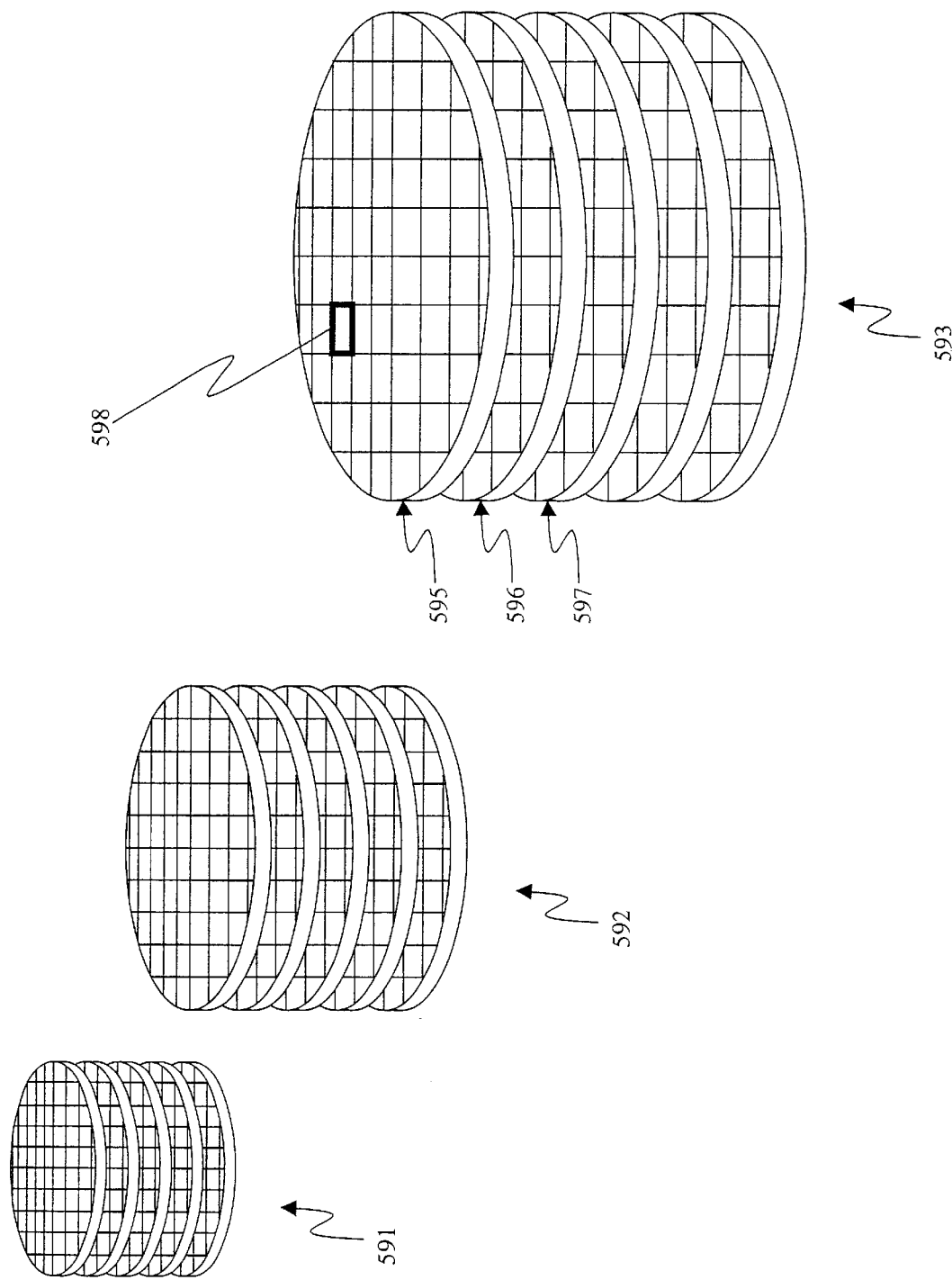
FIG. 5 illustrates a plurality of lots, each lot having a plurality of wafer-scale IC packages, each wafer-scale IC package having a plurality of ICs constructed thereon according to the principles of the present invention.

Turning to FIG. 5, illustrated is a plurality of lots 591–593 constructed according to the principles of the present invention. One skilled in the art understands that the above described method for manufacturing an IC including a bipolar transistor, the method including implanting an oxide region, may also be employed in the manufacture of wafer-scale IC packages, and that a plurality of manufacturing lots may be formed, each lot including a plurality of the wafer-scale IC packages.

In the illustrated embodiment, wafer-scale IC packages 595–597 each include a plurality of ICs formed thereon, one of the ICs designated as 598. The IC 598 may be constructed according to the above described methods of manufacturing a bipolar transistor or IC, the methods including implanting an oxide region in the base of the bipolar transistor. A manufacturing lot 593 may comprise a plurality of the wafer-scale IC packages 595–597. A manufacturing method may include forming a plurality of manufacturing lots 591–593, wherein each of the ICs or bipolar transistors formed in the manufacture of the lots 591–593 may be constructed according to the principles of the present invention. In this manner, uniformity of the oxide regions of the bipolar transistors or ICs between the wafers 595–597 and between the lots 591–593 may be provided. The oxide region uniformity may, in turn, reduce variation in performance characteristics of the bipolar transistors and ICs between the wafers 595–597 and between the lots 591–593, including current gain and breakdown voltage. In one embodiment, the above described methods of manufacturing may reduce the variation in the thicknesses of the oxide regions to about 5%, thereby reducing the wafer to wafer and lot to lot variation in the current gain and breakdown voltage of the devices to about 10%.

Although the present invention has been described in detail, those skilled in the art should understand that they can make various changes, substitutions and alterations herein without departing from the spirit and scope of the invention.

What is claimed is:

1. A method of manufacturing a bipolar transistor, comprising:
   forming a collector in a semiconductor substrate;
   forming a base in said collector;
   implanting an oxide region within said collector and over said base; and
   forming an emitter over said substrate such that said oxide region is located between said emitter and said base.

2. The method as recited in claim 1 wherein implanting an oxide region includes implanting an oxide region having a dopant concentration ranging from about 1E12 atoms/cm$^3$ to about 1E16 atoms/cm$^3$.

3. The method as recited in claim 1 wherein implanting an oxide region includes implanting an oxide region having a thickness ranging from about 0.5 nm to about 0.7 nm.

4. The method as recited in claim 1 wherein implanting an oxide region includes implanting an oxide region having a width ranging from about 200 nm to about 1000 nm.

5. The method as recited in claim 1 further including annealing said oxide region at a temperature of about 1000° C. for about 10 seconds.

6. The method as recited in claim 1 wherein forming an emitter includes blanket depositing an emitter poly layer having a thickness of about 240 nm.

7. The method as recited in claim 1 further including forming a complementary metal oxide semiconductor (CMOS) transistor device adjacent said bipolar transistor, said bipolar transistor and said CMOS transistor device interconnected to form an integrated circuit.

8. The method as recited in claim 1 wherein forming a bipolar transistor includes forming a bipolar transistor adjacent a p-type metal oxide semiconductor (PMOS) transistor.

9. The method as recited in claim 1 wherein implanting an oxide region includes implanting an oxide region using a power ranging from about 0.5 KeV to about 100 KeV, a temperature ranging from about 0° C. to about 400° C.

10. A method of manufacturing an integrated circuit, comprising:
    forming transistors over a semiconductor substrate;
    forming bipolar transistors over said substrate, including:
      forming a collector within said substrate;
      forming a base in said collector;
      implanting an oxide region within said collector and over said base; and
      forming an emitter over said substrate such that said oxide region is located between said emitter and said base; and
    forming interconnects over said transistors and said bipolar transistors to form an operative integrated circuit.

11. The method as recited in claim 10 wherein implanting an oxide region includes implanting an oxide region having a dopant concentration ranging from about 1E14 atoms/cm$^3$ to about 1E16 atoms/cm$^3$.

12. The method as recited in claim 10 wherein implanting an oxide region includes implanting an oxide region having a thickness ranging from about 0.5 nm to about 0.7 nm.

13. The method as recited in claim 10 wherein implanting an oxide region includes implanting an oxide region having a width ranging from about 200 nm to about 1000 nm.

14. The method as recited in claim 10 further including annealing said oxide region at a temperature of about 1000° C. for about 10 seconds.

15. The method as recited in claim 10 wherein forming an emitter includes blanket depositing an emitter poly layer having a thickness of about 240 nm.

16. The method as recited in claim 10 wherein forming transistors includes forming a complementary metal oxide semiconductor (CMOS) transistor device adjacent said bipolar transistor, said bipolar transistor and said CMOS transistor device interconnected to form an integrated circuit.

17. The method as recited in claim 10 wherein forming a bipolar transistor includes forming a bipolar transistor adjacent a p-type metal oxide semiconductor (PMOS) transistor.

18. The method as recited in claim 10 wherein implanting an oxide region includes implanting an oxide region using a power ranging from about 0.5 KeV to about 100 KeV, a temperature ranging from about 0° C. to about 400° C.

19. A method of manufacturing a plurality of wafer lots wherein each wafer of said wafer lots contains a plurality of integrated circuits thereon, comprising:
    forming transistors over each wafer;
    forming bipolar transistors over and within each of said wafers, including:
      forming a collector within said substrate;
      forming a base in said collector;
      implanting an oxide region within said collector and over said base, said implanting providing a thickness of said oxide region of each of said bipolar transistors that varies from one wafer lot to another wafer lot by at most about 5%; and
      forming an emitter over said substrate such that said oxide region is located between said emitter and said base; and
    forming interconnects that interconnect said transistors and said bipolar transistors to form operative integrated circuits on said wafers.

20. The method as recited in claim 19 wherein said implanting provides each of said bipolar transistors with current gain and breakdown voltage values varying from one wafer lot to another wafer lot by at most about 10%.

* * * * *